United States Patent
Ahn

(10) Patent No.: US 6,445,313 B2
(45) Date of Patent: Sep. 3, 2002

(54) DATA MODULATING/DEMODULATING METHOD AND APPARATUS FOR OPTICAL RECORDING MEDIUM

(75) Inventor: Seong Keun Ahn, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/776,626

(22) Filed: Feb. 6, 2001

(30) Foreign Application Priority Data

Feb. 7, 2000 (KR) .............................................. 00-5613
May 4, 2000 (KR) ............................................. 00-24079

(51) Int. Cl.[7] .............................................. H03M 7/00
(52) U.S. Cl. ............................. 341/59; 341/58; 341/68
(58) Field of Search ............................... 341/58, 59, 68

(56) References Cited

U.S. PATENT DOCUMENTS

| | | | |
|---|---|---|---|
| 5,952,944 A | * | 9/1999 | Nonaka et al. ................ 341/59 |
| 6,172,622 B1 | * | 1/2001 | Nakagawa et al. ............ 341/59 |
| 6,268,810 B1 | * | 7/2001 | Shim et al. .................... 341/59 |
| 6,297,753 B1 | * | 10/2001 | Hayami ........................ 341/59 |
| 6,300,886 B1 | * | 10/2001 | Hayami ........................ 341/59 |

* cited by examiner

Primary Examiner—Michael Tokar
Assistant Examiner—Khai M. Nguyen
(74) Attorney, Agent, or Firm—Birch, Stewart, Kolasch & Birch, LLP

(57) ABSTRACT

A data modulating/demodulating method and apparatus for an optical recording medium that is capable of keeping a digital sum value at a minimum value. In the method, a source data is converted into a coded data by a first conversion table in which the coded data corresponding to the source data is registered. The coded data is converted into a first channel data suitable for the optical recording medium. A second conversion table is registered with a coded data for suppressing a DC component in correspondence with a specific source data such that a digital sum value of the first channel data becomes a minimum value. The specific source data is converted into the coded data for a direct current restraint by the second decoding table and then converted into a second channel data. A digital sum value for the first and second channel data is calculated to select a coded data in which the digital sum value becomes a minimum value from the first and second conversion tables. The selected coded data is converted into the channel data and then recorded on the optical recording medium.

26 Claims, 13 Drawing Sheets

DATA MODULATING/DEMODULATING METHOD AND APPARATUS FOR OPTICAL RECORDING MEDIUM

FIELD OF THE INVENTION

This invention relates to a technique of modulating/demodulating a data in an optical recording medium.

DESCRIPTION OF THE PRIOR ART

Nowadays, an optical recording medium has been developed as a recording medium for recording various informations, such as video and audio information, etc., and has been commercially available in the market Such an optical recording medium includes a read-only type disc such as CD-ROM and DVD-ROM, etc., and a rewritable disc such as CD-R, DVD-R, CD-RW and DVD-RAM, etc.

A conventional rewritable disc modulates and demodulates a digital signal so as to stabilize an operation of a servo system upon recording of the digital signal and stabilize a reproducing clock upon reproducing thereof. Such a modulating/demodulating system for the optical recording medium has to satisfy the requirements of a high code conversion efficiency, a stable reproducing clock, an assurance of a jitter margin for a stable data detection, a small direct current (DC) component or a digital sum value (DSV) for stabilizing a data detection and a tracking servo, no error propagation or a very small error propagation and a decoding/encoding based on a small bit number for improving a recording density.

A modulating system for a CD series has adopted EFM (eight to fourteen modulation) method while a modulating system for a DVD series has adopted EFM+ (eight to fourteen modulation plus) method. By these modulating methods, a data signal with a radio frequency band is converted into a signal with a low frequency band so as to stabilize an operation of the servo system.

The EFM method converts a one-byte or 8-bit data into a 17-bit symbol data including three-bit merging words, hereinafter referred to as "modulated data". On the other hand, the EFM+ method converts an 8-bit data into a 16-bit modulated data depending on the previous state. The modulated data is converted into a NRZI (non-return to zero inverted) code and then recorded on the optical recording medium by a mark edge method. In the data recorded on the optical recording medium in this manner, RLL (run length limited) codes, generally designated as (d, k) codes, are widely applied. Herein, d and k represent minimum and maximum run length respectively. In RLL codes, at least d "zeros" are recorded between successive data "ones", and no more than k "zeros" are recorded between successive data "ones". Since "ones" at the disc means a shift, the d constraint aims at preventing intersymbol interference. The k constraint aims at making a reproducing clock by giving a sufficient shift for a data upon reproduction. For instance, in a (2, 10) codes of DVD, there are at least two "zeros" between recorded "ones", and there are no more than ten recorded contiguous "zeros" between recorded "ones". At this time, since a data recorded is converted into the NRZI code, a minimum time interval and a maximum time interval of the recorded data are (d+1)T and (k+1)T, respectively. Herein, T represents a channel bit interval. Accordingly, in the case of a (2, 10) code, a time interval of the data recorded on the disc exists between 3T and 11T.

Such a modulating system takes a fixed block scheme of making a one-to-one mapping of a source data into a coded data using a conversion table. To this end, the conversion table of the DVD consists of a four-set main-table in which 256 types of 16-bit code words are stored and a four-set sub-table in which 98 types of 16-bit code words from 0 to until 87 are stored. The fixed block scheme satisfies a RLL within one byte (or 8 bits), but may not satisfy a RLL between bytes, provided that there are a code rate and a RLL constraint. If a RLL is not satisfied between bytes, then one bit is added between bytes. In addition, one bit is added to minimize a DSV. Furthermore, one bit is added to satisfy a RLL again. Accordingly, if a RLL is not satisfied between bytes of the data, total three bits are added. As a result, the fixed block scheme has an advantage in the respect of a small error propagation due to the one-to-one mapping, but has a disadvantage in the respect of a limited recording capacity due to the added bits between bytes.

Meanwhile, the modulating system used for the DVD has a problem in that additional merging bits are not required since the mapping is made according to the previous state. But an encoding/decoding algorithm is complex and a large number of tables are required. A method of modulating/demodulating the present data depending on the previous data in this manner is called a look-ahead scheme. This look-ahead scheme has a low hardware complexity because an encoding/decoding algorithm is simple, and is capable of further improving a recording capacity in comparison with the fixed block scheme because only two bits of merging bits are required for a DC suppression. However, the look-ahead scheme has a drawback in that, since the present data depends on the next data or the previous data, if any one data generate an error, the next data is liable to generate an error due to such an error.

A rewritable high-density optical recording medium trends toward a code rate of ⅔ and a RLL of (1,7) or (1,8) for encoding a 8-bit source data into a 12-bit code data in order to assure a jitter margin and improve a recording capacity. In this case, a DSV must be kept at a minimum value for a stabilization of the reproduction data and the servo system.

SUMMARY OF THE INVENTION

Accordingly, it is an object of the present invention to provide a data modulating/demodulating method and apparatus for an optical recording medium that is capable of keeping a DSV at a an minimum value.

A further object of the present invention is to provide a data modulating/demodulating method and apparatus for an optical recording medium that is capable of preventing an error propagation as well as improving a recording density.

A still further object of the present invention is to provide an optical recording medium in which a data modulated by the above-mentioned modulating method has been recorded.

In order to achieve this and other objects of the invention, a data modulating method for an optical recording medium according to one aspect of the present invention includes the steps of; preparing a first set of conversion tables where a source data is converted into a coded data; preparing a second set of conversion tables for a specific source data to be converted into a coded data; converting a source data into a first and a second bit stream of coded data using both of sets of the conversion tables; calculating a digital sum value for the first and second bit streams whenever the second coded data converted from the specific source data is found; selecting the coded data stream that has smaller digital sum value; and converting the selected code data stream into a channel data stream to be recorded on the optical recording medium, wherein the code conversion rate of the conversion tables is ⅔ such that source data of a 2, 4, 6 or 8-bit data are converted into a 3, 6, 9 or 12-bit data, wherein the converted coded data stream maintains a (d, k) constraint of (1, 8), and wherein no merging bit is used between converted coded data.

A data modulating method for an optical recording medium according to another aspect of the present invention includes the step of adding a dummy bit to the source data under the (d, k) constraint to encode the source data.

A data modulating method for an optical recording medium according to still another aspect of the present invention includes the step of: preparing a set of conversion tables where a source data is converted into a coded data; converting a source data into a bit stream of coded data using the conversion tables; and converting said coded data stream into a channel data stream to be recorded on the optical recording medium, wherein the code conversion rate of the conversion tables is ⅔ such that source data of a 2, 4, 6 or 8-bit data are converted into a 3, 6, 9 or 12-bit data, wherein the converted coded data stream maintains a (d, k) constraint of (1, 8), and wherein no merging bit is used between converted coded data.

An optical recording medium according to still another aspect of the present invention is recorded with a data encoded by the above-mentioned data modulating methods.

A data demodulating method for an optical recording medium according to still another aspect of the present invention includes the steps of: detecting the channel data from the optical recording medium; preparing a first decoding table in which an decoded data corresponding to the channel data is registered; preparing a second decoding table registered with a decoded data identical to an individual coded data selected in response to a specific source data such that a digital sum value of the channel data becomes a minimum value upon encoding; and decoding the channel data detected from the optical recording medium using the first and second tables.

A data demodulating method for an optical recording medium according to still another aspect of the present invention includes the step of eliminating a dummy bit included a channel data detected from the optical recording medium upon encoding to decode the channel data.

A data modulating apparatus for an optical recording medium according to still another aspect of the present invention includes: a first set of conversion tables where a source data is converted into a coded data; a second set of conversion tables for a specific source data to be converted into a coded data; first converting means for converting a source data into a first and a second bit stream of coded data using both of sets of the conversion tables; means for calculating a digital sum value for the first and second bit streams whenever the second coded data converted from the specific source data is found; means for selecting the coded data stream that has smaller digital sum value; and second converting means for converting the selected code data stream into a channel data stream to be recorded on the optical recording medium, wherein the code conversion rate of the conversion tables is ⅔ such that source data of a 2, 4, 6 or 8-bit data are encoded into a 3, 6, 9 or 12-bit data, wherein the converted coded data stream maintains a (d, k) constraint of (1, 8), and wherein no merging bit is used between converted coded data.

A data modulating apparatus for an optical recording medium according to still another aspect of the present invention includes data encoding means for adding a dummy bit to a source data under the (d, k) constraint to encode the source data.

A data modulating apparatus for an optical recording medium according to still another aspect of the present invention includes: a set of conversion tables where a source data is converted into a coded data; first converting means for converting a source data into a bit stream of coded data using the conversion tables; and second converting means for converting the said coded data stream into a channel data stream to be recorded on the optical recording medium, wherein the code conversion rate of the conversion tables is ⅔ such that source data of a 2, 4, 6 or 8-bit data are converted into a 3, 6, 9 or 12-bit data, wherein the converted coded data stream maintains a (d, k) constraint of (1, 8), and wherein no merging bit is used between converted coded data.

An optical recording medium according to still another aspect of the present invention is recorded with a data encoded by the above-mentioned data modulating apparatuses.

A data demodulating apparatus for an optical recording medium according to still another aspect of the present invention includes: detecting means for detecting the channel data from the optical recording medium; first decoding means for decoding the channel data detected from the optical recording medium using a first decoding table in which an decoded data corresponding to the channel data is registered; and second decoding means for decoding the channel data detected from the optical recording medium using a second decoding table registered with a decoded data identical to an individual coded data selected in response to a specific source data such that a digital sum value of the channel data becomes a minimum value upon encoding.

A data demodulating apparatus for an optical recording medium according to still another aspect of the present invention includes decoding means for eliminating a dummy bit included the channel data detected from the optical recording medium upon encoding to decode the channel data.

BRIEF DESCRIPTION OF THE DRAWINGS

This and other objects of the invention will be apparent from the following detailed description of the embodiments of the present invention with reference to the accompanying drawings, in which.

DETAILED DESCRIPTION OF THE PREFERRED EMBODIMENT

Figure 1:
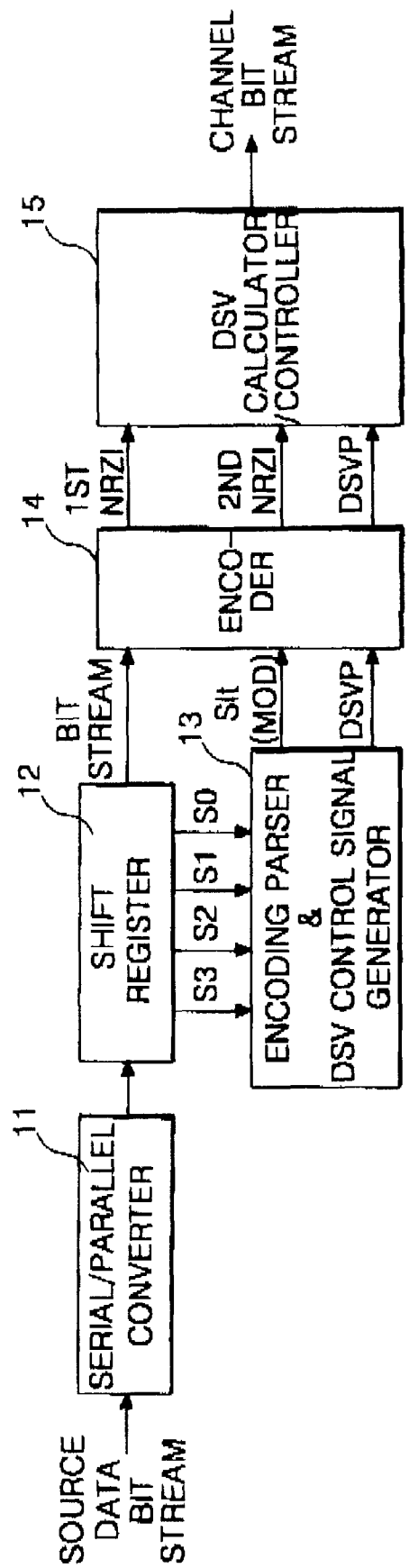
FIG. 1 is a schematic block diagram showing a configuration of a modulating apparatus according to a first embodiment of the present invention.

In a data modulating/demodulating method for an optical recording medium according to the preferred embodiments of the present invention, a code rate is ⅔ and RLL is (1,8). To this end, 3-bit code words are assigned for 2-bit source words as indicated in the following table:

TABLE 1

| Source Word | Code Word |
| --- | --- |
| 00 | 010 |
| 01 | 001 |
| 10 | 100 |
| 11 | 101 |

In the Table 1, if the source word is "00", then "1" is inserted between "0" and "0"; and if "01", then "0" is inserted between "0" and "1" in consideration of a minimum run length. Similarly, if the source word is "10" and "11", then "1" is inserted between "0" and "1" and "0" is inserted between "1" and "1".

In the ⅔ bit conversion table of the above table 1, when a 2-bit source word train is continued, a condition of a minimum run length being equal to "1" may not be satisfied. When both the second bit and the third bit in the successive 4-bit source word bit train is "1", the minimum run length is not satisfied. More specifically, when "01" and "10"; "01" and "11"; "11" and "10"; and "11" and "11" occur in succession, the minimum length condition is not satisfied. In consideration of an event that the minimum length condition is not satisfied, 6-bit code words are assigned for 4-bit source words as indicated in the following table:

TABLE 2

| Source Word | Code Word |
| --- | --- |
| 01 10 | 010 000 |
| 01 11 | 001 000 |
| 11 10 | 000 100 |
| 11 11 | 101 000 |

As seen from the Table 2, since any pattern excluding "100" fails to follow "000", the code word detected upon decoding may be set to a forbidden state in the event that other pattern excluding "100" follows "000" and that "000" follows "100". If a forbidden state is set for a specific bit pattern, then a forbidden pattern having a code word upon decoding detected into "000 100" or "100 000" can be utilized for an error detection.

Upon decoding, if the currently detected data is "010" and the next data is "000", then a conversion of the source code into "01 10" is made as seen from the decoding table of the Table 2. In other words, if the source word is "01 10", an encoding based on a look-ahead scheme is used. Otherwise, if the source word is "01 11, "11 10" or "11 11", then "11" is always converted into "000". In other words, the source word "11" is converted into "000" rather than "101" when the d constraint is not satisfied and is detected into "11" upon decoding. In this manner, the code word "000" becomes a alias pattern of the code word "101" for the source word "11" like a basic pattern "101" of the source word "11".

If the conversion table as described in the Table 2 is used for a data encoding, then the current data can be directly determined on a basis of an inversion of the encoding procedure as described in the Table 1, independently of the next data, in the remaining event except for "010 000" upon data decoding.

When compared with the conventional look-ahead scheme in which there are four events that the adjacent next data should be referred when a 6-bit code word is converted into a 4-bit word upon data decoding, the present method is limited to only one event that the code word is "010 000". Accordingly, the present method can reduce the number of the event that error propagation may occur in comparison to the conventional look-ahead scheme. When a data is decoded on a basis of the conversion tables as described in the Table 1 and the Table 2, the code word "010 000 100" is not identified definitely, In other words, the code word "010 000 100" can be detected into "01 10 10" or "10 11 10" by the conversion tables such as the Table 1 and Table 2. To this end, a 6/9 conversion table such as the following Table 3 and a 8/12 conversion table such as the following Table 4 are further provided.

TABLE 3

| Source Word | Code Word |
| --- | --- |
| 00 11 10 (110) | 010 100 000 |

In the table 3, "(110)" means the event that last two bits of the source is "10", that is, the event of "00", "01" or "11".

TABLE 4

| Source Word | Code Word |
| --- | --- |
| 00 11 10 10 | 001 000 000 010 |

In the Table 3 and the Table 4, individual code words are assigned only for a 6-bit source word and an 8-bit source word having an indefinite identification. The code words "010 100 000" and "001 000 000 010" detected upon decoding on a basis of the Table 3 and the Table 4 is uniquely determined as a decoding data.

As can be seen from Table 2 to Table 4, in the present data modulating/demodulating method, a data is encoded and decoded by the look-ahead scheme only for three events that the source word is "01 10", "00 11 10 (110)" and "00 11 10 10". Such a modulating/demodulating method is capable of reducing the number of events that the current data and the next data should be referred to ⅓ or less in comparison to the conventional look-ahead scheme. Accordingly, the number of events that error propagation occurs also can be reduced to that extent. In real, in connection with the number of events that an error is propagated into two bytes (or 16 bits) with respect to one bit error in the conventional modulating/demodulating method, the number of such events in the conventional look-ahead scheme is 65536 and the number of such events in the conventional parity preserving scheme is 20480. On the other hand, the number of events that an error is propagated into two bytes in the present modulating/demodulating method is 5376. Accordingly, the conventional look-ahead scheme causes an error propagate of up to 25% and the conventional parity preserving structure causes an error propagation of up to 31.25%. On the other hand, the present modulating/demodulating method causes an error propagation of only 8.2%.

However, when a data is encoded on a basis of Table 1 to Table 4, a low frequency component, that is, a DC component can be mixed with the coded data. In order to restrain such a DC component, the present modulating/demodulating method for the optical recording medium encodes the source word into a code word in which the number of "1" is odd and a code word in which the number of "1" is even upon data encoding, and selects the code word having a small DSV value. To this end, the present data modulating/demodulating method is further provided with conversion tables such as Table 5 and Table 6.

TABLE 5

| Source Word | Code Word |
| --- | --- |
| 10 | 000 |

In Table 5, the source word "10" is converted into the code word "000". In other words, the source word "10" is converted into "100" by Table 1 or into "000" by Table 5. Thus, a code word in which an absolute value of a DSV in a code word in which the number of "1" is odd and a code word in which the number of "1" is even is selected to be written into the disc. The conversion Table 5 is not used when a bit pattern identical to the code words registered in Table 2 to Table 4 is generated or the d constraint is not satisfied is the resulting coded data stream. Upon decoding, when the code word "000" has been input, it is decoded into the source word "10" unless it is matched with the patterns in Table 1 to Table 4.

TABLE 6

| Source Word | Code Word |
| --- | --- |
| 11 11 | 100 000 |

In Table 6, the source word "11 11" is converted into the code word "100 000". In other words, the source word "11 11" is converted into "100 000" by Table 6 or into "101 000" by Table 2. Thus, a code word in which an absolute value of a DSV in a code word in which the number of "1" is odd and a code word in which the number of "1" is even is selected to be written into the disc. The conversion Table 7 is not used when a bit pattern identical to the code words registered in Table 2 to Table 4 is generated or the k constraint is not satisfied is the resulting coded data stream.

Code words for restraining a DC component can be given to the source words indicated in Table 5 and Table 6 as well as other source words.

Meanwhile, the source word "11 00 11 00" or "00 11 00 11" is converted into "101 010 101 010" or "010 101 010 101" by the conversion table such as Table 1 and, thus, "10" or "01" is continuously repeated six times in the code word. If "01" or "10" is detected in several repetitions from the code word, the data reproducing apparatus loses a reproducing clock to make a data reproduction itself impossible. In order to solve this problem, a data modulating/demodulating method according another embodiment of the present invention assigns individual code words to a 8/12 conversion table such as Table 7 for a source word pattern having a repetition of "01" or "10" upon data decoding.

TABLE 7

| Source Word | Code Word |
| --- | --- |
| 11 00 11 00 | 010 000 000 010 |
| 00 11 00 11 | 001 010 000 010 |

In Table 7, since the low-order six bits of the code word for preventing a repetition of "10" or "01" is a forbidden pattern "000 010", the code word for preventing a repetition of "10" or "01" can be identified from other code words upon decoding. Even when a look-ahead code word for preventing a repetition of "01" or "10" in the code word is added in this manner, error propagation may occur. The number of events that an error is propagated into two bytes due to an addition of the look-ahead code word is no more than ⅓ in comparison to the conventional modulating/demodulating method in view of an addition of 512 to 5376.

In the conversion tables of Table 1 to Table 7, an alias pattern for the source word "11" has been set to "000" in the case of the embodiments, but may be set to other patterns. FIG. 1 to FIG. 7 show a modulating/demodulating apparatus for an optical recording medium according to a first embodiment of the present invention.

Referring to FIG. 1, the present modulating apparatus according to the first embodiment of the present invention includes a shift register 12, an encoding parser/DSV control signal generator 13, and an encoder 14 that are connected in series between a serial/parallel converter 11 and a DSV calculator/controller 15. The serial/parallel converter 11 converts a serial source data bit stream from an input line into a two-bit parallel data and supplies it to the shift register 12. The shift register 12 consists of four registers and shifts the two-bit source data inputted from the serial/parallel converter 11 every cycle. Also, the shift register 12 supplies the two-bit source data, that is, four source data S0 to S3 having total 8 bits to the encoding parser 13 and the encoder 14. The encoding parser/DSV control signal generator 13 compares the four source data S0 to S3 supplied from the shift register 12 with the source data registered in the conversion tables of Table 1 to Table 6 to determine their identity. Furthermore, the encoding parser/DSV control signal generator 13 generates a selection signal Slt(MOD) and a DSV pointer DSVP and applies them to the encoder 14. The selection signal Slt(MOD) consists of four bits. The two most significant bits of the selection signal Slt(MOD) allows the encoder 14 to select an conversion table in which a code word corresponding to the source data has been registered from the conversion tables of Table 1 to Table 6. The two least significant bits of the selection signal Slt(MOD) selects a code word from the corresponding conversion table when any one of Table 1 and Table 2 is selected. For instance, when the most significant bits of the selection signal Slt (MOD) is "11", the conversion table of Table 1 is selected. In this case, since one source word and one code word have been registered in the conversion table of Table 4, the least significant bits of the selection signal Slt(MOD) do not care any bit value. If the most significant bits of the selection signal Slt(MOD) is "10" or "01", then any one of the conversion tables of Table 1 and Table 2 is selected. At this time, any one of four events in the conversion table of Table 1 or Table 2 is selected. The DSV pointer DSVP is supplied to the encoder 13 as a logical value "1" when the source word is converted into a code word registered in the conversion tables of Table 5 and Table 6 which are prepared for suppressing a DC component. The encoder 14 converts a bit stream from the shift register 12 into a code word of the conversion table pointed by the selection signal Slt(MOD). Further, the encoder 14 converts the code word into a NRZI code and supplies it to the DSV calculator/controller 15. Herein, a data converted into a code word registered in Table 1 to Table 4 is supplied to the DSV calculator/controller 15 as the first NRZI code, whereas a data converted into a code word registered in Table 3 to Table 6 is applied to the DSV calculator/controller 15 as the second NRZI code. The DSV calculator/controller 15 selects any one of the first and second NRZI codes in accordance with a logical value of the DSV pointer DSVP inputted via the encoder 14. If a logical value of the DSV pointer DSVP is "1", the first NRZI code is selected. Otherwise, if a logical value of the DSV pointer DSVP is "0", the second NRZI code is selected. The NRZI code outputted from the DSV calculator/controller 15 is recorded on the optical recording medium in a shape of channel bit stream.

Figure 2:
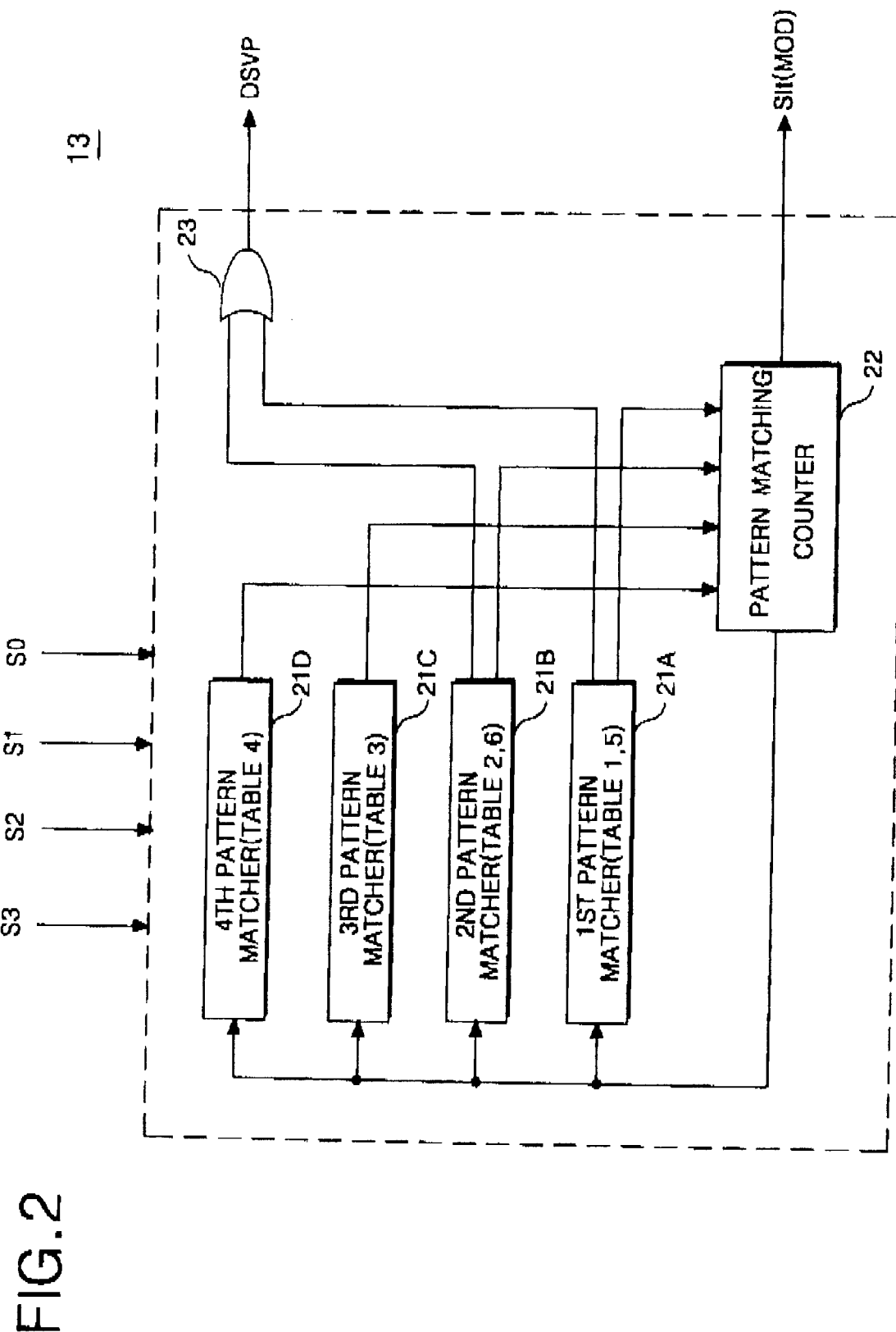
FIG. 2 is a detailed block diagram of the encoding parser and the DSV control signal generator shown in FIG. 1.

Referring to FIG. 2, the encoding parser/DSV signal generator 13 includes first to fourth pattern matchers 21A to 21D connected in parallel to a pattern matching counter 22, and an OR gate 23 for generating a DSV pointer DSVP. The pattern matching counter 22 generates a selection signal Slt(MOD) allowing the encoder 14 to select the conversion table. The first to fourth pattern matchers 21A to 21D compares the source data S0 to S3 with source words in the conversion tables of Table 1 to Table 6 to apply a bit signal indicating their identity to the pattern matching counter 22. To this end, the conversion tables of Table 1 and Table 5 are stored in the first pattern matcher 21A while the conversion tables of Table 2 and Table 6 are stored in the second pattern matcher 21B. Further, the conversion table of Table 3 is stored in the third pattern matcher 21C while the conversion table of Table 4 is stored in the fourth pattern matcher 21D. Each of the first to fourth patter matchers 21A to 21D consists of a memory in which the conversion table is stored, and a comparator for comparing the source data S0 to S3 with the source word in the conversion table. The OR gate 23 makes a logical sum operation of two input signals from the first and second pattern matchers 21A and 21B to generate the DSV pointer DSV.

Such an encoding parser/DSV control signal generator 13 interrupts a pattern matching or a retrieval until all of the four two-bit source data S0 to S3 are converted by the encoder 14 and, thereafter, begins a pattern matching again when a conversion of the four two-bit source data S0 to S3 has been completed. Assuming that the currently input source data S0 to S3 should be "00 11 10 10" and the next waiting source data should be "01 10 10 00", an operation of the encoding parser/DSV control signal generator 13 will be described below. First, at a current cycle, the encoding parser/DSV control signal generator 13 matches the current source data S0 to S3 with the conversion table of Table 4. At this time, the most significant bits of the selection signal Slt(MOD) generated from the pattern matching counter 22 has a bit value of "11" to point the conversion table of Table 4. The first two-bit source data S0 is supplied from the shift register 12 in synchronization with the selection signal Slt(MOD). If the first two-bit source data S0 inputted to the encoder 14 is "00", then it is converted into the code word "001" registered in the conversion table of Table 4 by the encoder 14. At the next cycle, a count value of the pattern matching counter 22 is decreased from "4" into "3 " to indicate that one bit pattern has been encoded. At this time, the shift register 12 shifts the source data, thereby allowing a value of the four two-bit source data S0 to S4 to be "11 10 10 01" and allowing the first source data S0 of "11" to be applied to the encoder 14. When a count value of the pattern matching counter 22 becomes "0" through such a repetition of the pattern matching and the conversion, an encoding of the identical pattern is completed and the encoding parser/DSV control signal generator 13 begins a pattern matching again. If the source data from the shift register 12 is "10", then it is matched with the conversion tables of Table 1 and Table 5 stored in the first pattern matcher 21A. At this time, when the source data "10" has been matched with the conversion tables of Table 1 and Table 5, the conversion tables of Table 1 and Table 5 are selected if that code word pattern is not identical to the code word pattern in Table 4 or if it satisfies a d constraint. If the source data is matched with the conversion tables of Table 1 and Table 5 or Table 2 and Table 6, the DSV pointer DSVP outputted from the OR gate 23 is applied to the encoder 14 as "1". When the source data has been matched with the conversion tables of Table 1 and Table 5 or Table 2 and Table 6, a logical value of the DSV pointer DSVP outputted from the OR gate 23 remains at "0" if that code word pattern is identical to the code word pattern in Table 2 to Table 4 or if it does not satisfy a d constraint.

Figure 3:
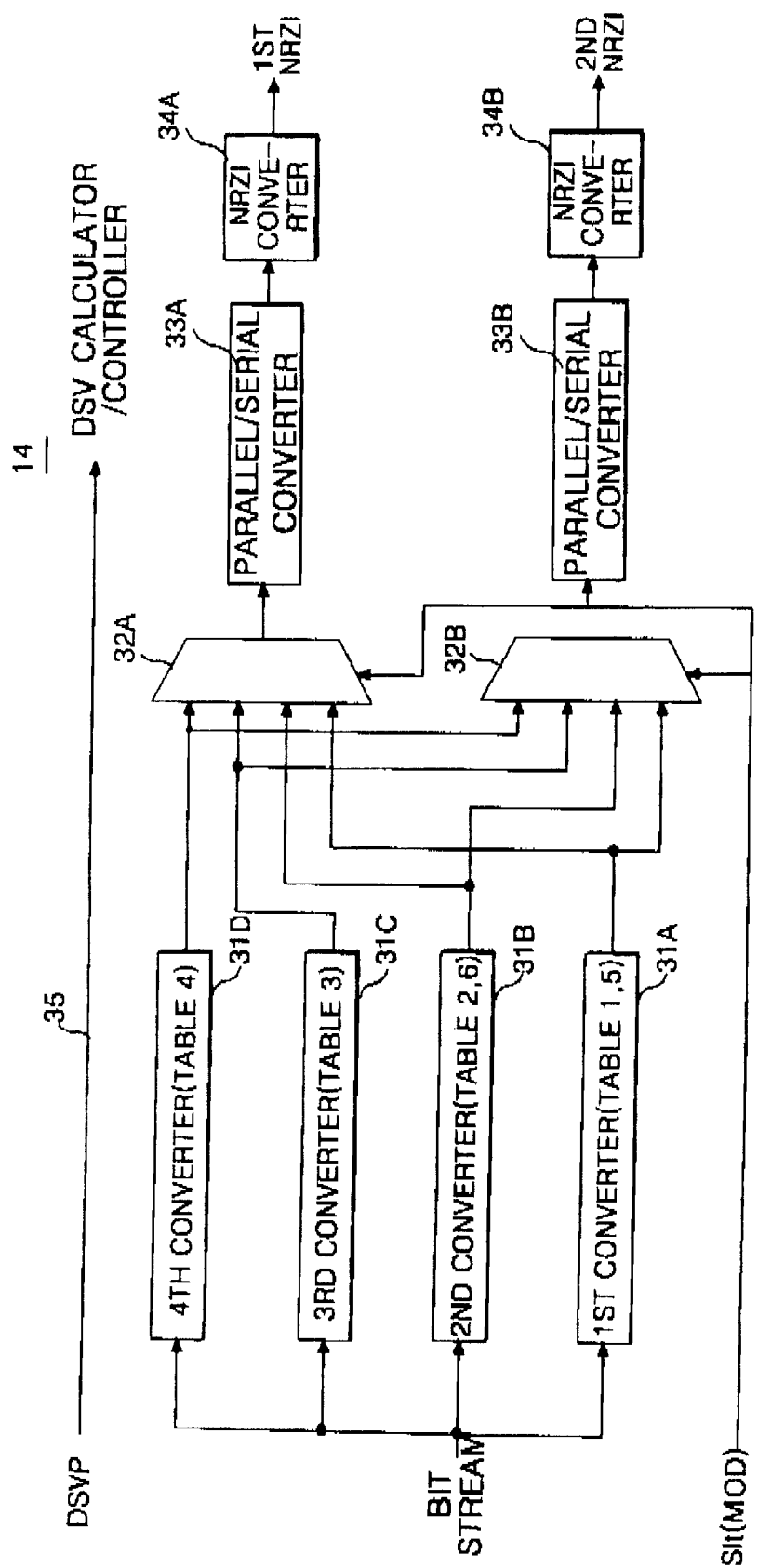
FIG. 3 is a detailed block diagram of the encoder shown in FIG. 1.

Referring to FIG. 3, the encoder 14 includes first to fourth converters 31A to 31D to which a source data bit stream from the shift register 12 is commonly supplied, first and second multiplexors 32A and 32B connected commonly to output terminals of the first to fourth converters 31A to 31B, parallel/serial converters 33A and 33B connected, in series, to the first and second multiplexors 32A and 32B, respectively, NRZI converters 34A and 34B connected, in series, to the parallel/serial converters 33A and 33B, respectively, and a DSVP bus line 35 to which the DSV pointer DSVP is applied. The converters 31A to 31D converts a source data bit stream inputted from the shift register 12 into the code word registered in Table 1 to Table 6 to commonly apply it to the first and second multiplexors 32A and 32B. To this end, the conversion tables of Table 1 and Table 5 are stored in the first converter 31A while the conversion tables of Table 2 and Table 6 are stored in the second converter 31B. Similarly, the conversion table of Table 3 is stored in the third converter 31C while the conversion table of Table 4 is stored in the fourth converter 31D. Each of the first and second multiplexors 32A and 32B has four input terminals to which a code word data from the converters 31A to 31D is supplied, a control terminal to which the selection signal Slt(MOD) is applied, and one output terminal. The multiplexors 32A and 32B play a role to select any one of output signals of the first to fourth converters 31A to 31D in accordance with a logical value of the selection signal Slt(MOD). A code word converted on the basis of Table 1 to Table 4 is inputted to the first multiplexor 32A. A code word converted on the basis of Table 3 to Table 6 is inputted to the second multiplexor 32B. If the selection signal Slt(MOD) is "1100", then the multiplexors 32A and 32B select a code word in Table 4 supplied from the fourth converter 31D and supply it to the parallel/ serial converters 33A and 33B. If the selection signal Slt (MOD) is "0010", then the multiplexors 32A and 32B select code words in Table 1 and Table 5 supplied from the first converter 31A and supply them to the parallel/serial converters 33A and 33B. In this case, the first multiplexor 32A selects the code word in Table 1 while the second multiplexor 32B selects the code word in Table 5. The code word selected by the first multiplexor 32A is converted into a serial data by the first parallel/serial converter 33A and then converted into the first NRZI code by the first NRZI converter 34A. Likewise, the code word selected by the second multiplexor 32B is converted into a serial data by the second parallel/serial converter 33B and then converted into the second NRZI code by the second NRZI converter 34B. The DSV pointer DSVP applied from the encoding parser/DSV control signal generator 13 is applied, via the DSV bus line 35, to the DSV calculator/controller 15.

Figure 4:
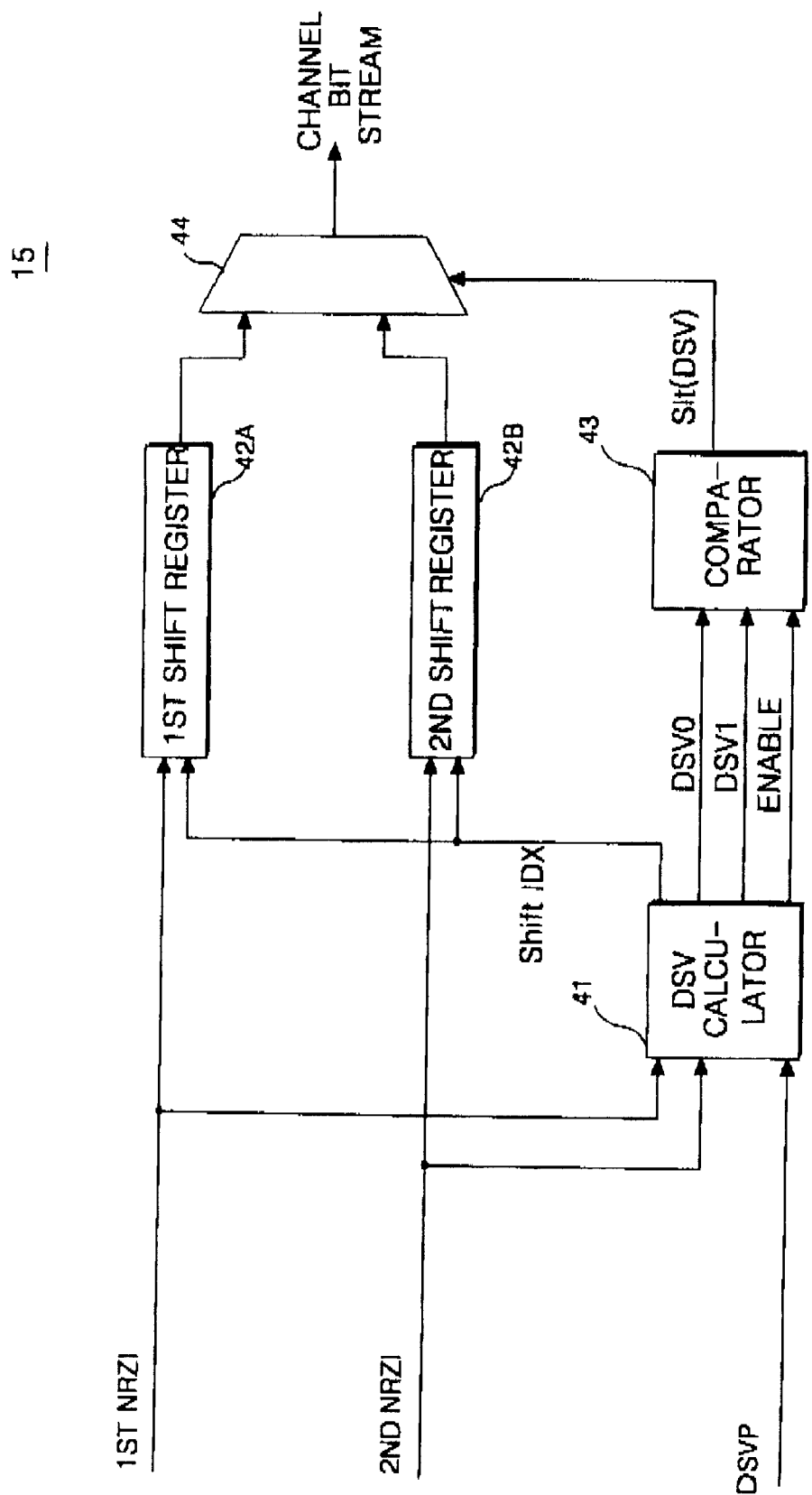
FIG. 4 is a detailed block diagram of the DSV calculator/controller shown in FIG. 1.

Referring to FIG. 4, the DSV calculator/controller 15 includes a first shift register 42A to which the first NRZI code is inputted, a second shift register 42B to which the second NRZI code is inputted, a DSV calculator 41 for receiving the first and second NRZI codes and the DSV pointer DSVP to control the first and second shift registers 42A and 42B, a multiplexor 44 connected to output terminals of the shift registers 42A and 42B, and a comparator 43 connected between the RSV calculator 41 and the multiplexor 44. The shift registers 42A and 42B receive the first and second NRZI codes from the first and second NRZI converters 34A and 34B to supply them to the multiplexor 44. The multiplexor 44 selects any one of the NRZI codes from the first and second shift registers 42A and 42B under control of the comparator 43. The NRZI code selected by the multiplexor 44 is recorded on the optical recording medium in a shape of channel bit stream. The DSV calculator 41 assigns "1" included in the NRZI code to "+1" and assigns "0" to "−1", and then counts these absolute values for each bit to calculate a DSV value for each of the first and second NRZI codes, thereby applying the DSV value to the comparator 43. Further, the DSV calculator 41 generates a shift index signal ShiftIDX for controlling the first and second shift registers 42A and 42B and applies it to control terminals of the first and second shift registers 42A and 42B. When a logical value of the DSV pointer DSVP is "1", a logical value of the shift index signal ShiftIDX also becomes "1". If a logical value of the shift index signal ShiftIDX is "1", then the first and second shift registers 42A and 42B go into in a latch state, that is, temporarily stores the first and second NRZI codes rather than shifting or outputting them. Accordingly, the DSV calculator 41 controls the first and second shift registers 42A and 42B such that a time difference between a time required for the DSV absolute values of the first and second NRZI codes and an output time of the first and second shift registers 42A and 42B can be compensated. Further, the DSV calculator 41 applies the first and second DSV absolute values DSV0 and DSV1 to the comparator 43 and generates an enable signal indicating a DSV control time to apply it to the comparator. When the first and second DSV absolute values DSV0 and DSV1 are supplied to the comparator 43, a logical value of the shift index signal ShiftIDX is changed into "0". At this time, the first and second registers 42A and 42B shift the first and second NRZI codes and supply them to the multiplexor 44. The comparator 43 generates a selection signal Slt(DSV) for controlling an output of the multiplexor 44. The selection signal Slt(DSV) instructs an output of the shift register 42A or 42B corresponding to a small value of the DSV absolute values DSV0 and DSV1 when a logical value of the enable signal from the DSV calculator 41 is "1". Also, the selection signal Slt(DSV) instructs an output of the first shift register 42A when a logical value of the enable signal from the DSV calculator 41 is "0". Accordingly, the multiplexor 44 selects an output signal of the shift register 42A or 42B corresponding to a small one of the DSV absolute values DSV and DSV1 at a DSV control time. Further, the multiplexor 44 selects an output signal of the first shift register 42A at a time other than the DSV control time.

More specifically, when a logical value of the DSV pointer DSVP is "0", the DSV calculator 41 maintains logical values of the shift index signal ShiftIDX and the enable signal at "0". Then, the multiplexer 44 is controlled by the comparator 43 responding to the enable signal to select an output signal of the first shift register 42A.

On the other hands when a logical value of the DSV pointer DSVP is "1", the DSV calculator 41 maintains logical values of the shift index signal ShiftIDX and the enable signal at "1". When a logical value of the shift index signal ShiftIDX is "1", the DSV calculator 41 calculates a DSV value for each of the first and second NRZI codes, and the first and second shift registers 42A and 42B latch the stored data. When the DSV absolute values DSV0 and DSV1 calculated by the DSV calculator 41 is supplied to the comparator 43, a logical value of the shift index signal ShiftIDX is changed into "1" again. At the same time, the multiplexer 44 responds to the selection signal Slt(DSV) from the comparator 43 to select an output of the shift register 42A or 42B corresponding to the DSV absolute value DSV0 or DSV1.

As described above, the data modulating method for the optical recording medium according to the present invention can keep the DSV at a minimum value by selecting a code word in which the polarity of the coded data, that is, the number of "1" is even or odd upon data encoding.

Figure 5:
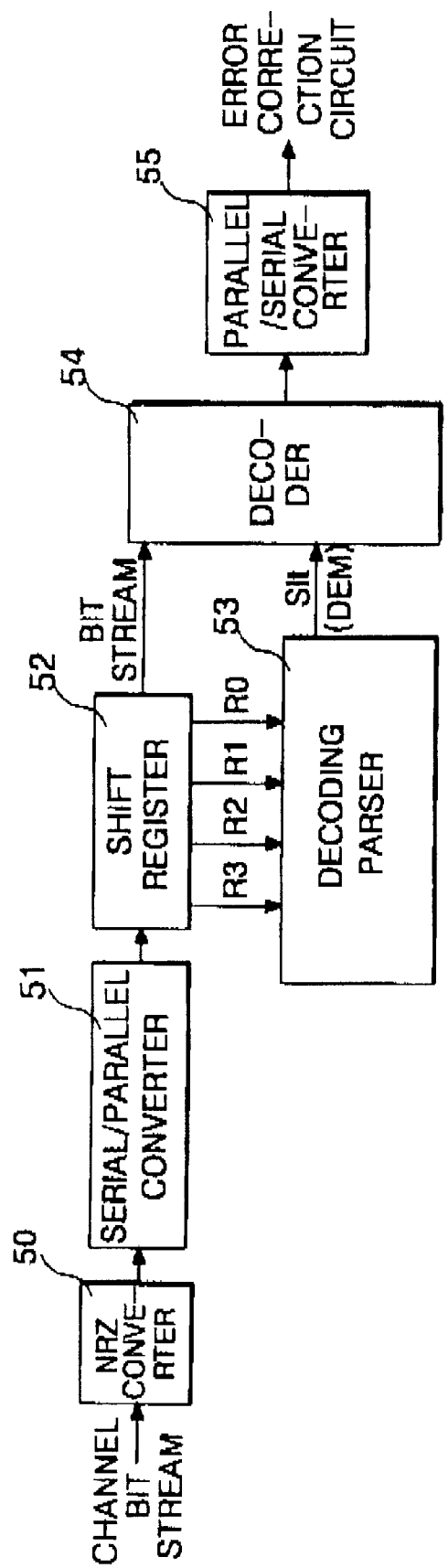
FIG. 5 is a schematic block diagram showing a configuration of a demodulating apparatus according to a first embodiment of the present invention.

Referring to FIG. 5, the demodulating apparatus according the first embodiment of the present invention includes a serial/parallel converter 51, a shift register 52, a decoding parser 53 and a decoder 54 that are connected, in series, between a NRZ converter 50 and a parallel/serial converter 55. The NRZ convener 50 converts a channel bit stream detected from the optical recording medium into a NRZ (non-return to zero) code and applies serially the converted NRZ code to the serial/parallel converter 51. The serial/parallel converter 51 converts the NRZ code received serially from the NRZ converter 50 and inputted serially thereto into a 3-bit parallel code data. The shift register 52 consists of four registers and shifts the 3-bit code data inputted from the serial/parallel converter 51 for each cycle. Also, the shift register 52 supplies four 3-bit code data (i.e., total 12-bit code data) R0 to R3 to the decoding parser 53 and the decoder 54. The decoding parser 53 compares the four code data R0 to R3 supplied from the shift register 52 with the code word pattern registered in advance in the decoding tables of Table 1 to Table 6 to determine their identity. Further, the decoding parser 53 generates a selection signal Slt(DEM) for selecting a decoding table utilized upon code conversion for the four code data R0 to R3 and supplies it to the decoder 54. The selection signal Slt(DEM) consists of 3 bits, The decoder 54 converts a bit stream from the shift register 52 into a source word in the corresponding decoding table in accordance with the selection signal Slt(DEM). The decoded data converted into the source word pattern by the decoder 54 in this manner is converted into a serial data by the parallel/serial converter 55. The serial data is applied to an error correction circuit (not shown).

Figure 6:
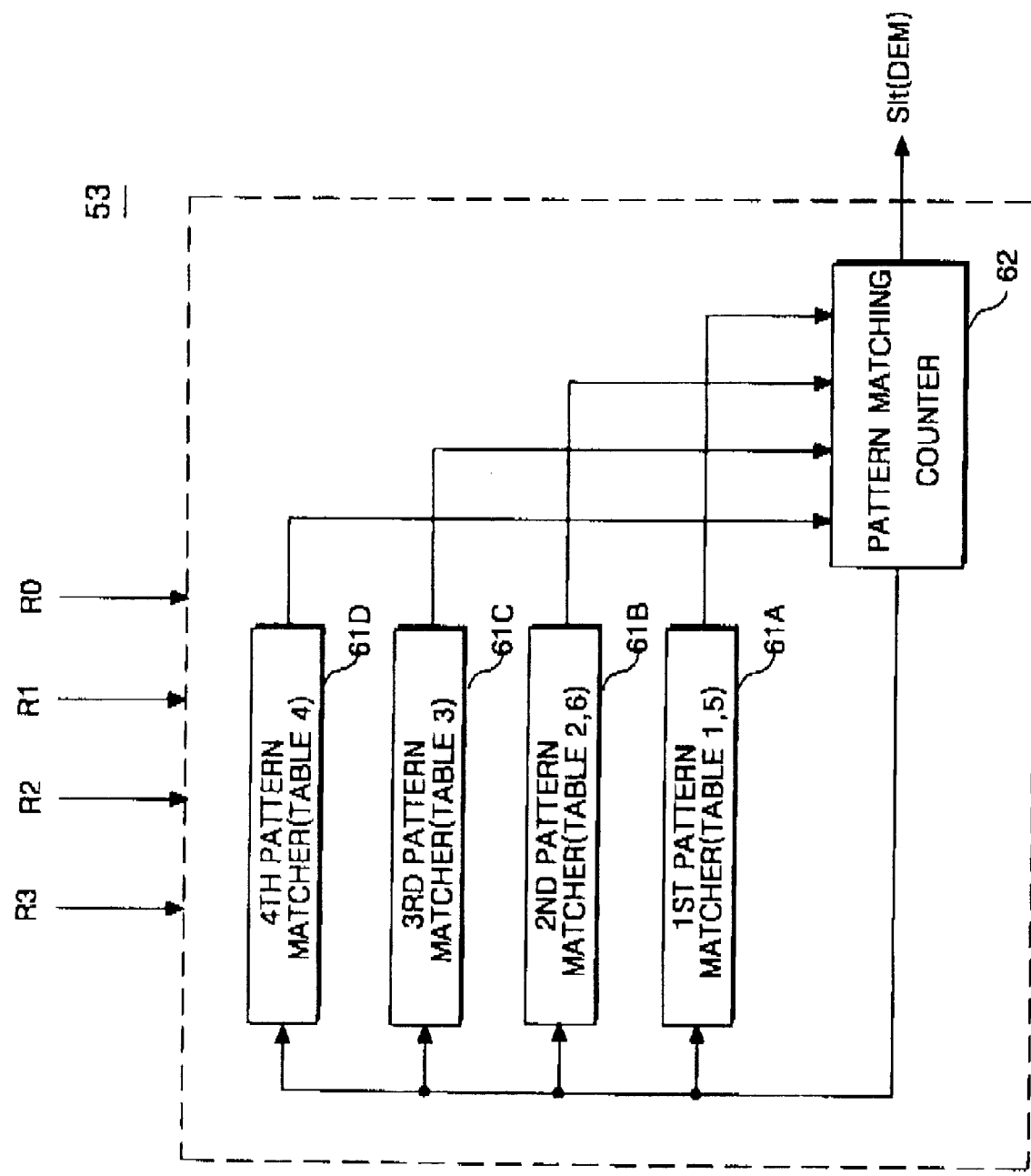
FIG. 6 is a detailed block diagram of the decoding parser shown in FIG. 5.

Referring to FIG. 6, the decoding parser 53 includes first to fourth pattern matchers 61A to 61D connected, in parallel, to a pattern matching counter 62. The pattern matching counter 62 allows the decoder 54 to generate the selection signal Slt(DEM) for selecting the decoding table. The first to fourth pattern matchers 61A to 61D compare the code data R0 to R3 with the code words in the decoding tables of Table 1 to Table 6 to apply a bit signal indicating their identity to the pattern matching counter 62. To this end, the decoding tables of Table 1 and Table 5 are stored in the first pattern matcher 61A while the decoding tables of Table 2 and Table 6 are stored in the second pattern matcher 61B. The decoding table of Table 3 is stored in the third pattern matcher 61C while the decoding table of Table 4 is stored in the fourth pattern matcher 61D. Each of the first to fourth pattern matchers 61A to 61D consists of a memory for storing the decoding tables and a comparator for comparing the code data R0 to R3 with the code words in the decoding tables.

The decoding parser 53 interrupts a pattern matching or a retrieval until all of the four 3-bit code data R0 to R3 are converted by the decoder 54 and thereafter begins a pattern matching again when a conversion for the four 3-bit code data R0 to R3 has been completed. If the code data R0 to R3 is recognized as a bit pattern that does not exist in the decoding tables of Table 1 to Table 6, then the decoding parser 53 determines the corresponding bit pattern as an error.

The selection signal Slt(DEM) generated from the pattern matching counter 62 can indicate total eight states, but only six states is used upon decoding. When the selection signal Slt(DEM) is "6", the decoding table of Table 6 is matched; and when the selection signal Slt(DEM) is "5", the decoding table of Table 5 is matched. Likewise, when the selection signal Slt(DEM) is "4", the decoding table of Table 4 is matched; when the selection signal Slt(DEM) is "3", the decoding table of Table 3 is matched; when the selection signal Slt(DEM) is "2", the decoding table of Table 2 is matched; and when the selection signal Slt(DEM) is "1", the decoding table of Table 1 is matched.

Assuming that the currently input code data R0 to R3 should be "001 000 000 010" and the next waiting code data should be "010 100 000", an operation of the decoding parser 53 will be described below. First, at a current cycle, the decoding parser 53 matches the current code data R0 to R3 with the decoding table of Table 4. At this time, a count value of the pattern matching counter 62 is set to "4". The first code data R0 of the shift register 52 along with the selection signal Slt(DEM) instructing the decoding table of Table 4 are applied to the decoder 54. At the next cycle, the code data R0 to R3 is converted into "000 000 010 010", and "001" inputted to the decoder 54 is converted into "00". At this time, a count value of the pattern matching counter 62 is decreased from "4" into "3" to indicate that one bit pattern has been encoded. A pattern matching and a conversion are repeated until a count value of the pattern matching counter 62 becomes "0". After all of the four code data R0 to R3 were converted, a pattern matching is initiated again.

Figure 7:
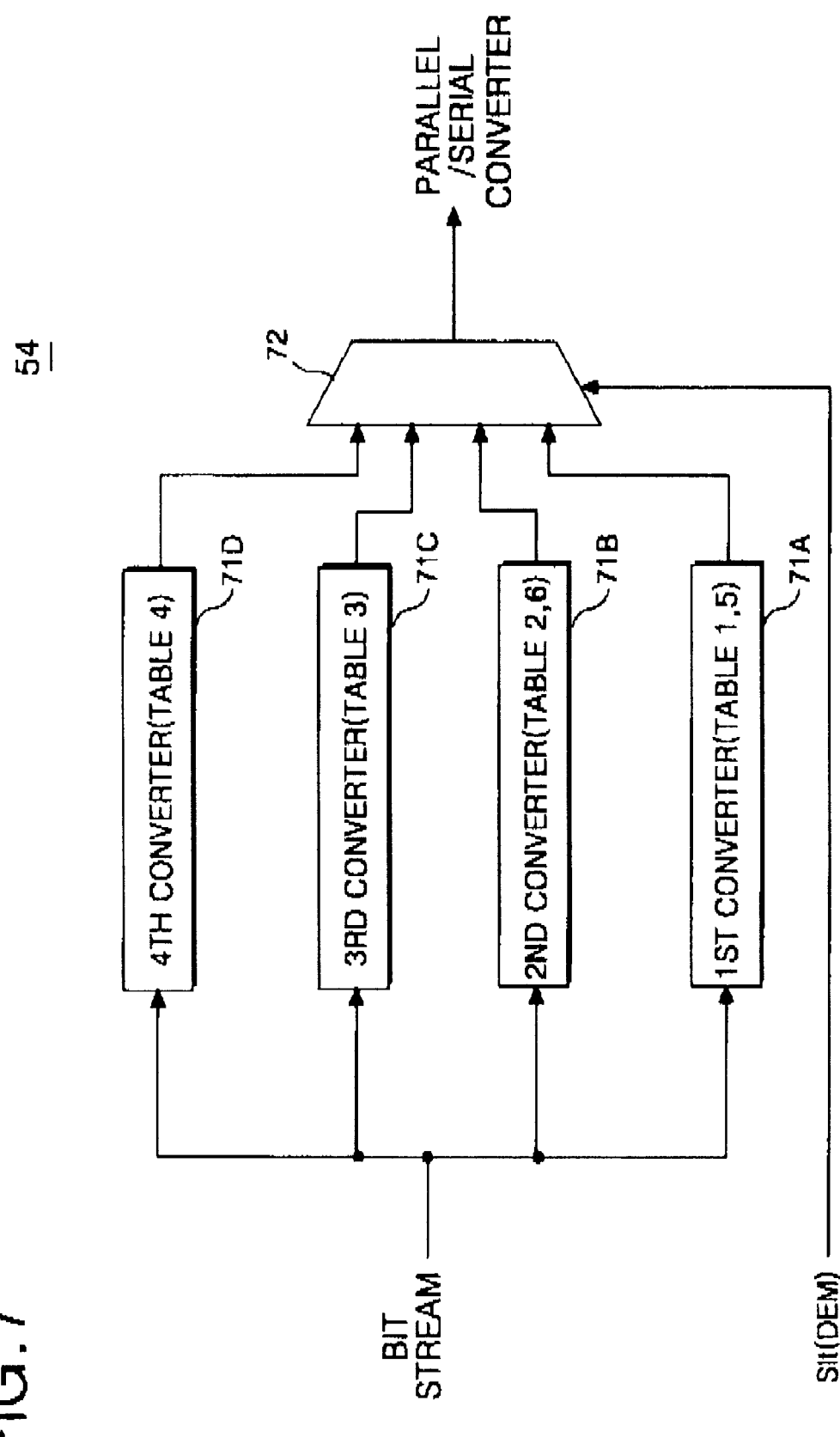
FIG. 7 is a detailed block diagram of the decoder shown in FIG. 5.

Referring to FIG. 7, the decoder 54 includes first to fourth converters 71A to 71D to which a code data bit stream from the shift register 52 is commonly supplied, and a multiplexer 72 connected commonly to output terminals of the first to fourth converters 71A to 71D. The converters 71A to 71D convert the code data bit stream inputted from the shift register 52 into a source word registered in Table 1 to Table 6 to apply it to the multiplexor 72. To this end, the decoding tables of Table 1 and Table 5 are stored in the first converter 71A while the decoding tables of Table 2 and Table 6 are stored in the second converter 71B. Similarly, the decoding table of Table 3 is stored in the third converter 71C while the decoding table of Table 4 is stored in the fourth converter 71D. The multiplexer 72 has four input terminals to which the code words from the converters 71A to 71D are supplied, a control terminal to which the selection signal Slt(DEM) is applied, and one output terminal. The multiplexor 72 selects any one of output signals of the first to fourth converters 71A to 71D in accordance with a logical value of the selection signal Slt(DEM).

FIG. 8 to FIG. 13 show a modulating/demodulating apparatus for an optical recording medium according to a second embodiment of the present invention.

Figure 8:
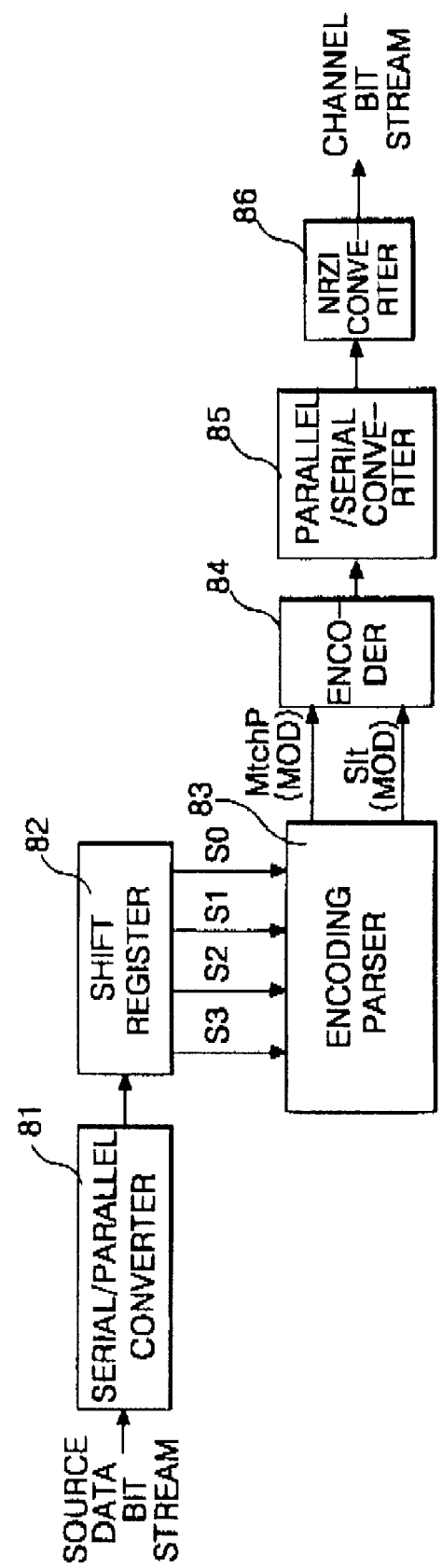
FIG. 8 is a schematic block diagram showing a configuration of a modulating apparatus according to a second embodiment of the present invention.

Referring to FIG. 8, the present modulating apparatus according to the second embodiment of the present invention includes a shift register 82, an encoding parser 83, an encoder 84 and a parallel/serial converter 85 that are connected, in series, between a serial/parallel converter 81 and a NRZI converter 86. The serial/parallel converter 81 converts a serial source data bit stream from an input line into a two-bit parallel data and supplies it to the shift register 82. The shift register 82 consists of four registers and shifts the two-bit source data inputted from the serial/parallel converter 81 for each cycle. Also, the shift register 82 supplies the two-bit source data, that is, four source data S0 to S3 having total 8 bits to the encoding parser 83. The encoding parser 83 compares the four source data S0 to S3 with the source data registered in advance in the conversion tables of Table 1 to Table 4 and Table 7 to determine their identity. Furthermore, the encoding parser 83 generates a selection signal Slt(MOD) to apply it to the encoder 84 and apply the first 2-bit source data S0 to the encoder 84 as a matching pattern MtchP(MOD). The selection signal Slt (MOD) consists of four bits. The two most significant bits of the selection signal Slt(MOD) allows the encoder 84 to select an conversion table in which a code word corresponding to the source data has been registered from the conversion tables of Table 1 to Table 6 and Table 7. The two least significant bits of the selection signal Slt(MOD) select a code word from the corresponding conversion table when any one of Table 1 and Table 2 is selected. If the most significant bits of the selection signal Slt(MOD) is "00", then the conversion tables of Table 4 and Table 7 are selected. Any one of three events in the conversion tables of Table 4 and Table 7 is selected depending on a bit value of the least significant bits. The encoder 84 converts the matching pattern MtchP(MOD) from the encoding parser 83 into a code word in any one conversion table of Table 1 to Table 4 and Table 7 selected by the selection signal Slt (MOD). The code data converted by the encoder in this manner is converted into a serial data by the parallel/serial converter 85 and then converted into a NRZI code by the NRZI converter 86.

Figure 9:
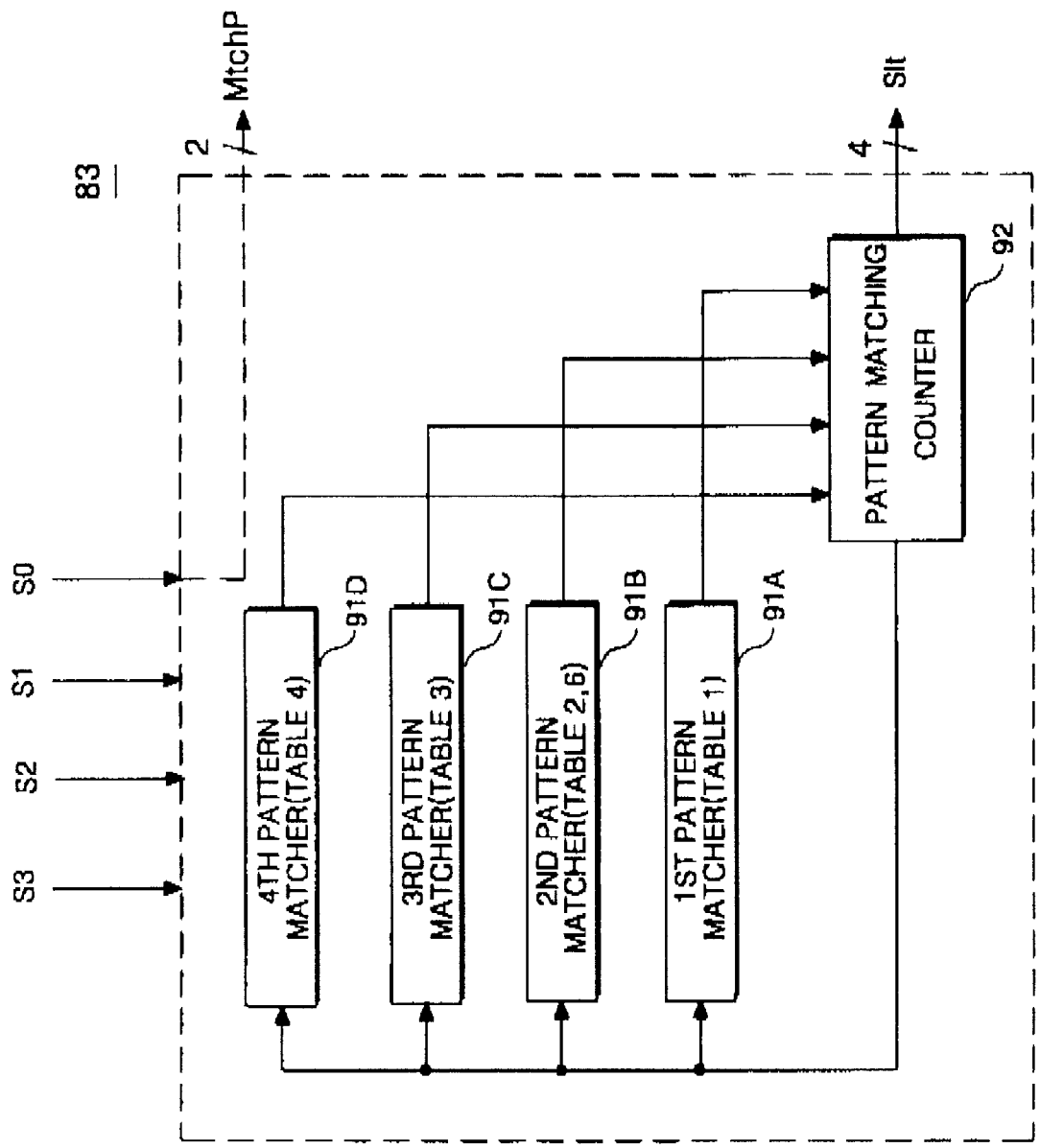
FIG. 9 is a detailed block diagram of the encoding parser shown in FIG. 8.

Referring to FIG. 9, the encoding parser 83 includes first to fourth pattern matchers 91A to 91D connected, in parallel, to a pattern matching counter 92. The pattern matching counter 92 generates a selection signal Slt(MOD) allowing the encoder 84 to select the conversion table. The first to fourth pattern matchers 91A to 91D compares the source data S0 to S3 with source words in the conversion tables of Table 1 to Table 4 and Table 7 to apply a bit signal indicating their identity to the pattern matching counter 92. To this end, the conversion table of Table 1 is stored in the first pattern matcher 91A while the conversion table of Table 2 is stored in the second pattern matcher 91B. Further, the conversion table of Table 3 is stored in the third pattern matcher 91C while the conversion tables of Table 4 and Table 7 are stored in the fourth pattern matcher 91D. Each of the first to fourth patter matchers 91A to 91D consists of a memory in which the conversion table is stored, and a comparator for comparing the source data S0 to S3 with the source word in the conversion table.

Such an encoding parser 83 interrupts a pattern matching or a retrieval until all of the four two-bit source data S0 to S3 are converted by the encoder 84 and, thereafter, begins a pattern matching again when a conversion of the four two-bit source data S0 to S3 has been completed.

A detailed explanation as to an operation of the encoding parser 83 will be omitted because it is substantially identical to an earlier explanation thereof referring to FIG. 2 except that the conversion table matching in Table 5 and Table 6 is replaced by an conversion table matching in Table 7 and the OR gate 93 for generating the DSV pointer DSVP are excluded.

Figure 10:
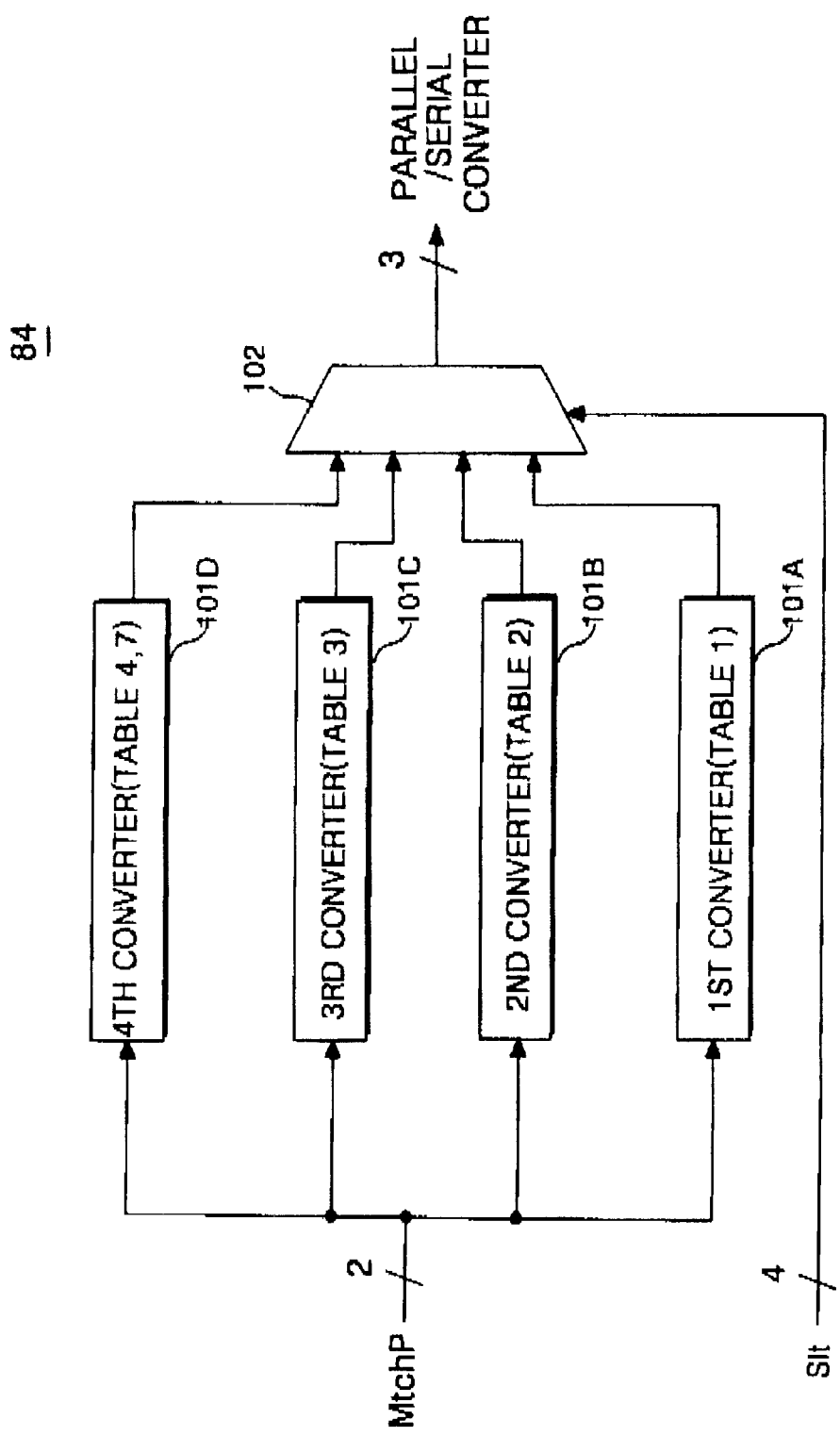
FIG. 10 is a detailed block diagram of the encoder shown in FIG. 8.

Referring to FIG. 10, the encoder 84 includes first to fourth converters 101A to 101D to which a source data bit stream having a matching pattern MtchP(MOD) from the shift register 82 is commonly supplied, and a multiplexor 102 connected commonly to output terminals of the first to fourth converters 101A to 101D. The converters 101A to 101D convert the matching pattern MtchP(MOD) from the encoding parser 83 into the code word registered in Table 1 to Table 4 and Table 7 to apply it to the multiplexor 102. To this end, the conversion table of Table 1 is stored in the first converter 101A while the conversion table of Table 2 is stored in the second converter 101B. Similarly, the conversion table of Table 3 is stored in the third converter 101C while the conversion tables of Table 4 and Table 7 are stored in the fourth converter 101D. The multiplexor 102 has four input terminals to which the code word data from the converters 101A to 101D is supplied, a control terminal to which the selection signal Slt(MOD) is applied, and one output terminal. The multiplexor 102 selects any one of output signals of the first to fourth converters 101A to 101D in accordance with a logical value of the selection signal Slt(MOD). For instance, if the selection signal Slt(MOD) is "0001", then the multiplexor 102 selects the code word in Table 4 supplied from the fourth converter 101D to apply it the parallel/serial converter 85.

Figure 11:
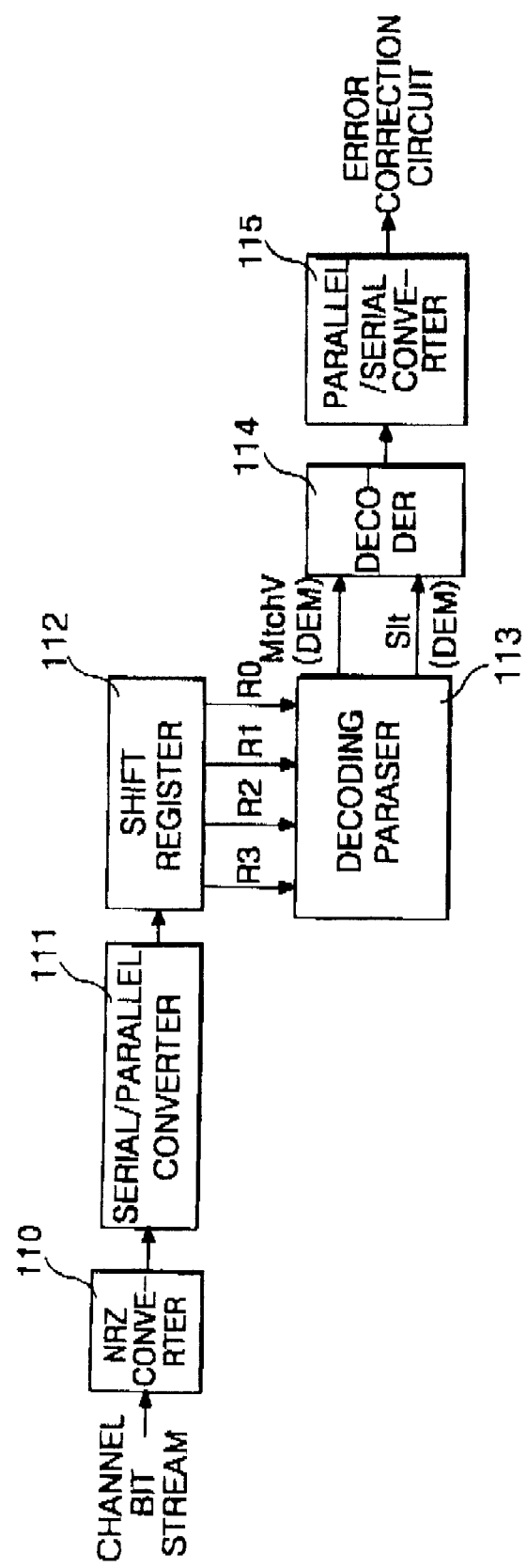
FIG. 11 is a schematic block diagram showing a configuration of a demodulating apparatus according to a second embodiment of the present invention.

Referring to FIG. 11, the demodulating apparatus according the second embodiment of the present invention includes a serial/parallel converter 111, a shift register 112, a decoding parser 113 and a decoder 114 that are connected, in series, between a NRZ converter 110 and a parallel/serial converter 115. The NRZ converter 110 converts a channel bit stream detected from the optical recording medium into a NRZ (non-return to zero) code and applies serially the converted NRZ code to the serial/parallel converter 111. The serial/parallel converter 111 converts the NRZ code received serially from the NRZ converter 111 and inputted serially thereto into a 3-bit parallel code data. The shift register 112 consists of four registers and shifts the 3-bit code data inputted from the serial/parallel converter 111 for each cycle. Also, the shift register 112 supplies four 3-bit code data (i.e., total 12-bit code data) R0 to R3 to the decoding parser 113. The decoding parser 113 compares the four code data R0 to R3 supplied from the shift register 112 with the code words pattern registered in advance in the decoding tables of Table 1 to Table 4 and Table 7 to determine their identity. Further, the decoding parser 113 generates a selection signal Slt (DEM) for selecting a decoding table utilized upon code conversion for the four code data R0 to R3, and supplies it to the decoder 114 and supplies the first 2-bit code data R0 to the decoder 114 as a matching pattern MtchP(DEM). The selection signal Slt(DEM) consists of 3 bits. The decoder 114 converts the matching pattern MtchP(DEM) from the decoding parser 113 into a source word in the corresponding decoding table in accordance with the selection signal Slt(DEM). The decoded data converted into the source word pattern by the decoder 114 in this manner is converted into a serial data by the parallel/serial converter 115. The decoded serial data is transferred from the parallel/serial converter 115 to an error correction circuit (not shown).

Figure 12:
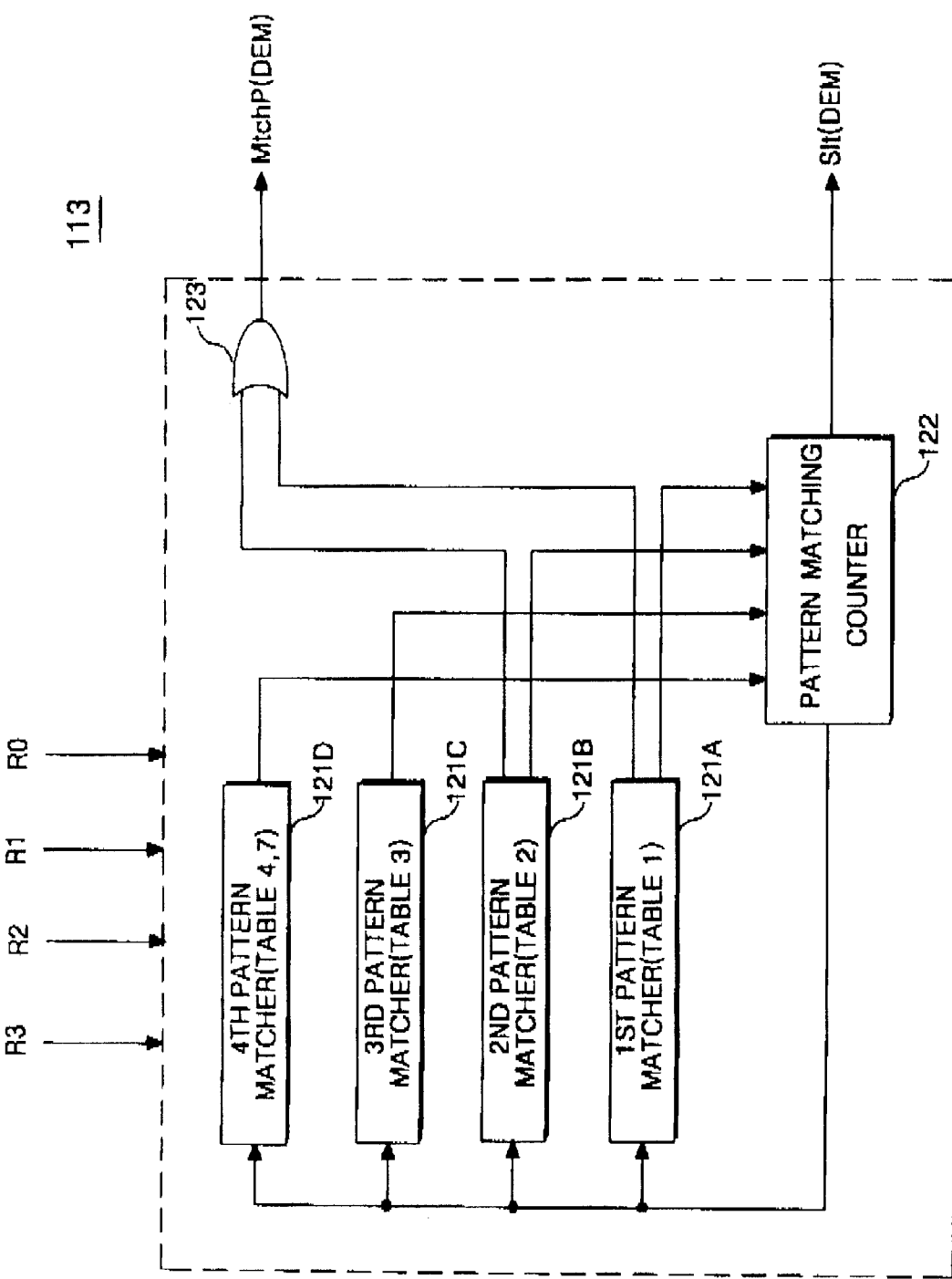
FIG. 12 is a detailed block diagram of the decoding parser shown in FIG. 11.

Referring to FIG. 12, the decoding parser 113 includes first to fourth pattern matchers 121A to 121D connected in parallel, to a pattern matching counter 122. The pattern matching counter 122 allows the decoder 114 to generate the selection signal Slt(DEM) for selecting the decoding table. The first to fourth pattern matchers 121A to 121D compare the code data R0 to R3 with the code words in the decoding tables of Table 1 to Table 4 and Table 7 to apply a bit signal indicating their identity to the pattern matching counter 122. To this end, the decoding table of Table 1 is stored in the first pattern matcher 121A while the decoding table of Table 2 is stored in the second pattern matcher 121B. The decoding table of Table 3 is stored in the third pattern matcher 121C while the decoding tables of Table 4 and Table 7 are stored in the fourth pattern matcher 121D. Each of the first to fourth pattern matchers 121A to 121D consists of a memory for storing the decoding tables and a comparator for comparing the code data R0 to R3 with the code words in the decoding tables.

The decoding parser 113 interrupts a pattern matching or a retrieval until all of the four 3-bit code data R0 to R3 are converted by the decoder 114 and thereafter begins a pattern matching again when a conversion for the four 3-bit code data R0 to R3 has been completed. If the code data R0 to R3 is recognized as a bit pattern that does not exist in the decoding tables of Table 1 to Table 4 and Table 7, then the decoding parser 113 determines the corresponding bit pattern as a forbidden pattern. The forbidden pattern is used for an error detection. More specifically, if any bit patterns other than "001" follow "100 000" or "000" in the code data R0 to R3, then the decoding parser 113 determines that an error has been generated at the corresponding bit pattern.

In the data demodulating method and apparatus according to the second embodiment of the present invention, look-ahead patterns decoded depending on the previous bit pattern and the next adjacent bit pattern are limited to "01 10", "00 11 10 (110)", "00 00 11 10 10" and "00 11 00 11". The remaining patterns other than these look-ahead pattern is normally decoded when both side bits excluding the middle bit in the three bits are taken. Accordingly, the present data demodulating method is capable of simplifying a decoding process and a hardware configuration. Meanwhile, an alias pattern "000" detected upon decoding is converted into "11".

The look-ahead patterns are decoded by a process as described below. The 3-bit selection signal Slt(DEM) inputted to the decoder 114 can indicate total eight states, but only five states are used upon decoding. When the selection signal Slt(DEM) is "5", the decoding table of Table 7 is matched; when the selection signal Slt(DEM) is "4", the decoding table of Table 4 is matched; when the selection signal Slt(DEM) is "3", the decoding table of Table 3 is matched; when the selection signal Slt(DEM) is "2", the decoding table of Table 2 is matched; and when the selection signal Slt(DEM) is "1", the decoding table of Table 1 is matched. The selection signal Slt(DEM) of "0" indicates a forbidden state. When the selection signal Slt(DEM) indicates a forbidden state, an error correction circuit (not shown) corrects the corresponding code data, considering that an error has been generated at the code data.

A detailed explanation as to an operation of the decoding parser 113 will be omitted because it is substantially identical to an earlier explanation thereof referring to FIG. 6.

Figure 13:
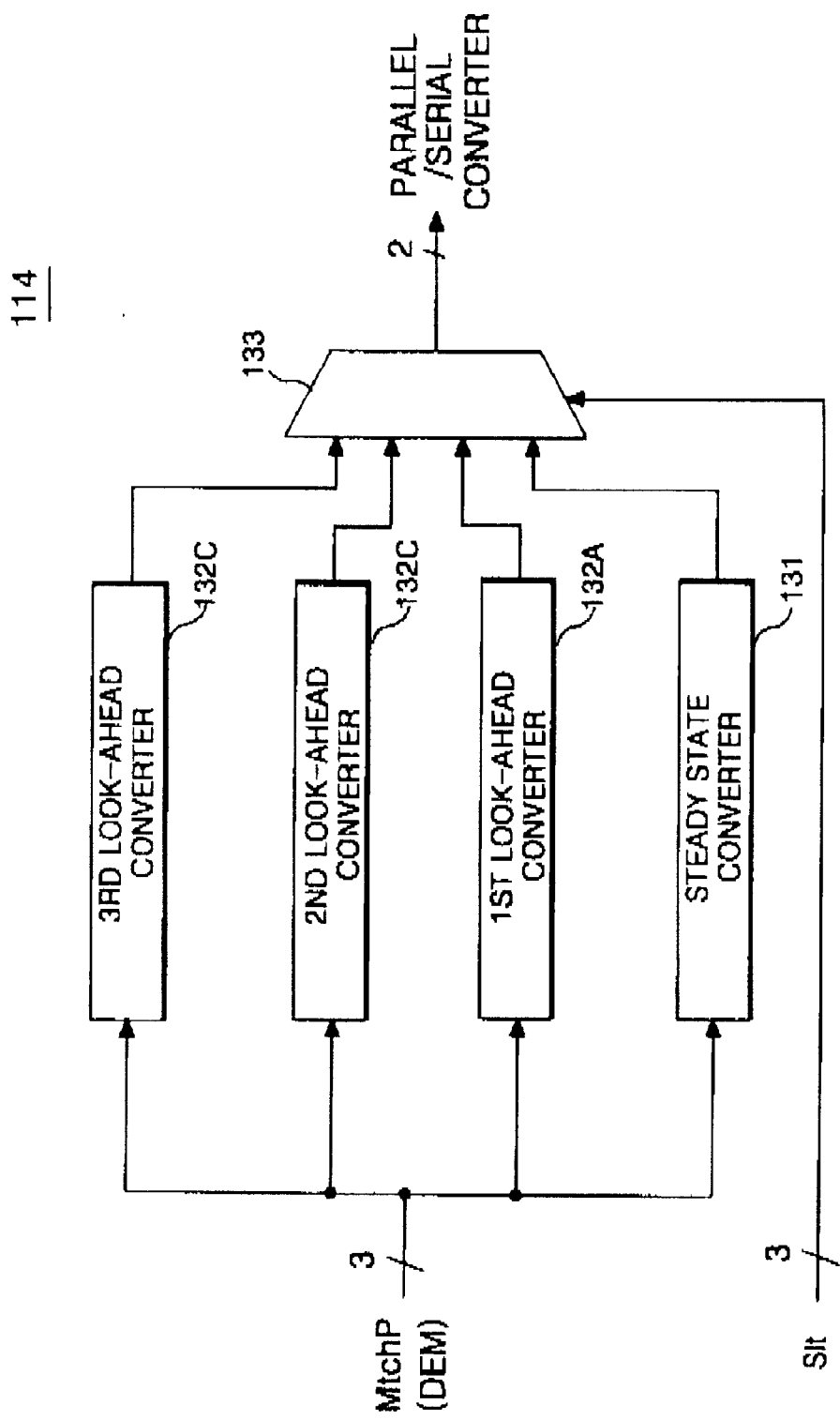
FIG. 13 is a detailed block diagram of the decoder shown in FIG. 11.

Referring to FIG. 13, the decoder 114 includes a steady state converter 131 and first to third look-ahead converters 132A to 132C to which the matching pattern MtchP(DEM) from the decoding parser 113 is commonly supplied, and a multiplexer 133 connected commonly to output terminals of the steady state converter 131 and the first to third look-ahead converters 132A to 132C. When the matching pattern MtchP(DEM) is identical to the code word registered in the decoding table of Table 1, the steady state converter 131 eliminates the middle bit and supplies the remaining two bits to the multiplexor 133. Further, when the matching pattern MtchP(DEM) is "000" rather than the look-ahead patterns in Table 2 to Table 5, the steady state converter 131 converts it into "11". When the matching pattern MtchP(DEM) is identical to the look-ahead patterns in Table 2 to Table 5, the first to third look-ahead converters 132A to 132C convert the matching pattern into the corresponding code word and supplies it to the multiplexor 133. To this end, the decoding table of Table 1 is stored in the steady state converter 131 while the decoding table of Table 2 is stored in the first look-ahead converter 132A. Similarly, the decoding table of Table 3 is stored in the second look-ahead converter 132B while the decoding tables of Table 4 and Table 5 are stored in the third look-ahead converter 132C. The multiplexor 133 has four input terminals to which the code words from the converters 131 and 132A to 132C are supplied, a control terminal to which the selection signal Slt(DEM) is applied, and one output terminal. The multiplexor 133 selects any one of output signals of the converters 131 and 132A to 132C in accordance with a logical value of the selection signal Slt(DEM).

As described above, according to the present invention, the DSV can be maintained at a minimum value to stabilize a reproduced data and a servo system. Also, an error propagation can be prevented and a recording density can be improved. In addition, a data encoded by the present modulating method is recorded on the present optical recording medium, so that the present optical recording medium can not only minimize an error included in the reproduced data upon reproduction to provide a stable data decoding, but also it can minimize a DC component to obtain a stable detection of a servo error signal. Moreover, the present optical recording medium is capable of recording a large capacity of information.

Although the present invention has been explained by the embodiments shown in the drawings described above, it should be understood to the ordinary skilled person in the art that the invention is not limited to the embodiments, but rather than that various changes or modifications thereof are possible without departing from the spirit of the invention. Accordingly, the scope of the invention shall be determined only by the appended claims and their equivalents.

What is claimed is:

1. A data modulating method for an optical recording medium wherein a source data is converted under a fixed code conversion rate and a (d, k) constraint, the method comprising the steps of:

preparing a first set of conversion tables where the source data is converted into a coded data, said first set of conversion tables including conversion tables for converting 2, 4, 6 and 8-bit data into 3, 6, 9 and 12-bit data respectively;

preparing a second set of conversion tables for a specific source data to be converted into a coded data, said second set of conversion tables including conversion tables for converting 2 and 4-bit data into 3 and 6-bit data respectively;

converting the source data into a first and a second bit stream of coded data using both of sets of the conversion tables;

calculating a digital sum value for the first and second bit streams whenever the second coded data converted from the specific source data is found;

selecting the coded data stream that has smaller digital sum value; and converting the selected code data stream into a channel data stream to be recorded on the optical recording medium, wherein the code conversion rate of the conversion tables is ⅔ such that source data of a 2, 4, 6 and 8-bit data are converted into a 3, 6, 9 and 12-bit data respectively, wherein the converted coded data stream maintains a (d, k) constraint of (1, 8), and wherein no merging bit is used between converted coded data.

2. The data modulating method as claimed in claim 1, wherein the first set of conversion tables include:

a first conversion table that is prepared to convert the source data into the coded data under the (d, k) constraint;

a second conversion table that is substituted for the first conversion table when the coded data stream converted by the first conversion table violates d constraint; and a third conversion table that is substituted for the first and second conversion table to prevent an identical coded data stream is converted into different source data stream when said channel data stream is demodulated.

3. The data modulating method as claimed in claim 1, wherein the specific source data is converted not by the second set of conversion tables but by the first set of conversion tables, in the case that a bit pattern of the coded data stream converted by the second set of conversion tables is identical to that of the coded data stream converted by the first set of conversion tables or that the k constraint is violated when it is converted into the coded data.

4. The data modulating method as claimed in claim 2, wherein the second conversion table of the first set of conversion converts a 4-bit data into a 6-bit data and includes a look-ahead coded data converted depending on the next source data to be converted and also includes at least one displacement of coded data.

5. The data modulating method as claimed in claim 1, wherein the first set of conversion tables include:

a fourth conversion table that is prepared to prevent a repeated minimum transition run in the coded data stream.

6. An optical recording medium on which a data encoded by the data modulating method as claimed in claim 1 is recorded.

7. A data modulating method for an optical recording medium wherein a source data is converted under a fixed code conversion rate and a (d, k) constraint, the method comprising the steps of:

preparing a set of conversion tables where the source data is converted into a coded data said set of conversion tables including conversion tables for converting 2, 4, 6 and 8-bit data into 3, 6, 9 and 12-bit data respectively;

converting the source data into a bit stream of coded data using the conversion tables; and converting said coded data stream into a channel data stream to be recorded on the optical recording medium, wherein the code conversion rate of the conversion tables is ⅔ such that source data of a 2, 4, 6 and 8-bit data are converted into a 3, 6, 9 and 12-bit data respectively, wherein the converted coded data stream maintains a (d, k) constraint of (1, 8), and wherein no merging bit is used between converted coded data.

8. The data modulating method as claimed in claim 7, wherein the set of conversion tables include:

a first conversion table that is prepared to convert the source data into the coded data under the (d, k) constraint;

a second conversion table that is substituted for the first conversion table when the coded data stream converted by the first conversion table violates d constraint; and a third conversion table that is substituted for the first and second conversion table to prevent an identical coded data stream is converted into different source data stream when said channel data stream is demodulated.

9. The data modulating method as claimed in claim 8, wherein the second conversion table of the first set of conversion converts a 4-bit data into a 6-bit data and includes a look-ahead coded data converted depending on the next source data to be converted and also includes at least one displacement of coded data.

10. The data modulating method as claimed in claim 7, wherein the first set of conversion tables include:

a fourth conversion table that is prepared to prevent a repeated minimum transition run in the coded data stream.

11. An optical recording medium on which a data encoded by the data modulating method as claimed in any one of claims 7 is recorded.

12. A data demodulating method for an optical recording medium wherein a channel data recorded on the optical recording medium is decoded, the method comprising the steps of:

detecting the channel data from the optical recording medium;

preparing a first decoding table in which an decoded data corresponding to the channel data is registered, said first decoding table including decoding tables for decoding 2, 4, 6 and 8-bit data into 3, 6, 9, and 12-bit data respectively;

preparing a second decoding table registered with a decoded data identical to an individual coded data selected in response to a specific source data such that a digital sum value of the channel data becomes a minimum value upon encoding, said second decoding table including decoding tables for decoding 2 and 4-bit data into 3 and 6-bit data respectively; and decoding the channel data detected from the optical recording medium using the first and second tables.

13. A data demodulating method for an optical recording medium wherein a channel data recorded on the optical recording medium is decoded, the method comprising the steps of:

eliminating a dummy bit included the channel data detected from the optical recording medium upon encoding to decode the channel data.

14. A data modulating apparatus for an optical recording medium wherein a source data is converted under a fixed code conversion rate and a (d, k) constraint, the apparatus comprising:

a first set of conversion tables where the source data is converted into a coded data said first set of conversion tables including conversion tables for converting 2, 4, 6 and 8-bit data into 3, 6, 9 and 12-bit data respectively;

a second set of conversion tables for the specific source data to be converted into a coded data said second set of conversion tables including conversion tables for converting 2 and 4-bit data into 3 and 6-bit data respectively;

first converting means for converting the source data into a first and a second bit stream of coded data using both of sets of the conversion tables;

means for calculating a digital sum value for the first and second bit streams whenever the second coded data converted from the specific source data is found;

means for selecting the coded data stream that has smaller digital sum value; and second converting means for converting the selected code data stream into a channel data stream to be recorded on the optical recording medium;

wherein the code conversion rate of the conversion tables is $2/3$ such that source data of a 2, 4, 6 or 8-bit data are encoded into a 3, 6, 9 or 12-bit data respectively, wherein the converted coded data stream maintains a (d, k) constraint of (1, 8), and wherein no merging bit is used between converted coded data.

15. The data modulating apparatus as claimed in claim 14, wherein the first set of conversion tables include:

a first conversion table that is prepared to convert the source data into the coded data under the (d, k) constraint;

a second conversion table that is substituted for the first conversion table when the coded data stream converted by the first conversion table violates d constraint; and a third conversion table that is substituted for the first and second conversion table to prevent an identical coded data stream is converted into different source data stream when said channel data stream is demodulated.

16. The data modulating apparatus as claimed in claim 14, wherein the specific source data is converted not by the second set of conversion tables but by the first set of conversion tables, in the case that a bit pattern of the coded data stream converted by the second set of conversion tables is identical to that of the coded data stream converted by the first set of conversion tables or that the k constraint is violated when it is converted into the coded data.

17. The data modulating apparatus as claimed in claim 15, wherein the second conversion table of the first set of conversion converts a 4-bit data into a 6-bit data and includes a look-ahead coded data converted depending on the next source data to be converted and also includes at least one displacement of coded data.

18. The data modulating apparatus as claimed in claim 14, wherein the first set of conversion tables include:

a fourth conversion table that is prepared to prevent a repeated minimum transition run in the coded data stream.

19. An optical recording medium on which a data encoded by the data modulating apparatus as claimed in claim 14 is recorded.

20. A data modulating apparatus for an optical recording medium wherein a source data is converted under a fixed code conversion rate and a (d, k) constraint, the apparatus comprising:

a set of conversion tables where the source data is converted into a coded data, said set of conversion tables including conversion tables for converting 2, 4, 6 and 8-bit data into 3, 6, 9 and 12-bit data respectively;

first converting means for converting the source data into a bit stream of coded data using the conversion tables; and second converting means for converting the said coded data stream into a channel data stream to be recorded on the optical recording medium, wherein the code conversion rate of the conversion tables is $2/3$ such that source data of a 2, 4, 6 and 8-bit data are converted into a 3, 6, 9 and 12-bit data respectively, wherein the converted coded data stream maintains a (d, k) constraint of (1, 8), and wherein no merging bit is used between converted coded data.

21. The data modulating apparatus as claimed in claim 20, wherein said set of conversion tables include:
    a first conversion table that is prepared to convert the source data into the coded data under the (d, k) constraint;
    a second conversion table that is substituted for the first conversion table when the coded data stream converted by the first conversion table violates d constraint; and
    a third conversion table that is substituted for the first and second conversion table to prevent an identical coded data stream is converted into different source data stream when said channel data stream is demodulated.

22. The data modulating apparatus as claimed in claim 21, wherein the second conversion table of the first set of conversion converts a 4-bit data into a 6-bit data and includes a look-ahead coded data converted depending on the next source data to be converted and also includes at least one displacement of coded data.

23. The data modulating apparatus as claimed in claim 20, wherein the first set of conversion tables include:
    a fourth conversion table that is prepared to prevent a repeated minimum transition run in the coded data stream.

24. An optical recording medium on which a data encoded by the data modulating apparatus as claimed in claim 20 is recorded.

25. A data demodulating apparatus for an optical recording medium wherein a channel data recorded on the optical recording medium is decoded, the apparatus comprising:
    detecting means for detecting the channel data from the optical recording medium;
    first decoding means for decoding the channel data detected from the optical recording medium using a first decoding table in which an decoded data corresponding to the channel data is registered, said first decoding table including decoding tables for decoding 2, 4, 6 and 8-bit data into 3, 6, 9, and 12-bit data respectively; and
    second decoding means for decoding the channel data detected from the optical recording medium using a second decoding table registered with a decoded data identical to an individual coded data selected in response to a specific source data such that a digital sum value of the channel data becomes a minimum value upon encoding, said second decoding table including decoding tables for decoding 2 and 4-bit data into 3 and 6-bit data respectively.

26. The data demodulating apparatus as claimed in claim 25, the apparatus comprising:
    decoding means for eliminating a dummy bit included the channel data detected from the optical recording medium upon encoding to decode the channel data.

* * * * *